(12) United States Patent
Misaka et al.

(10) Patent No.: US 10,962,874 B2
(45) Date of Patent: Mar. 30, 2021

(54) METHODS OF MANUFACTURING SEMICONDUCTOR DEVICES, METHOD SOF PERFORMING EXTREME ULTRAVIOLET RAY EXPOSURE, AND METHODS OF PERFORMING OPTICAL PROXIMITY CORRECTION

(71) Applicant: Samsung Electronics Co., Ltd., Suwon-si (KR)

(72) Inventors: Akio Misaka, Hwaseong-si (KR); No-young Chung, Hwaseong-si (KR); Ki-soo Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 185 days.

(21) Appl. No.: 16/382,351

(22) Filed: Apr. 12, 2019

(65) Prior Publication Data

US 2020/0064728 A1 Feb. 27, 2020

(30) Foreign Application Priority Data

Aug. 23, 2018 (KR) .................. 10-2018-0098756

(51) Int. Cl.
*G03F 1/36* (2012.01)
*G03F 7/20* (2006.01)

(52) U.S. Cl.
CPC .............. *G03F 1/36* (2013.01); *G03F 7/2004* (2013.01); *G03F 7/70441* (2013.01)

(58) Field of Classification Search
CPC ....... G03F 1/36; G03F 7/2004; G03F 7/70441
USPC ..................................... 430/5, 30
See application file for complete search history.

(56) References Cited

U.S. PATENT DOCUMENTS

| | | | |
|---|---|---|---|
| 7,827,520 B2 | 11/2010 | Choi | |
| 7,900,170 B2 | 3/2011 | Suh et al. | |
| 8,103,977 B2 | 1/2012 | Taoka et al. | |
| 8,719,740 B2 | 5/2014 | Taoka et al. | |
| 9,116,438 B2 | 8/2015 | Lee et al. | |
| 9,651,855 B2* | 5/2017 | Sun | ........................... G03F 1/36 |
| 2007/0174807 A1 | 7/2007 | Kumashiro et al. | |
| 2011/0029936 A1 | 2/2011 | Baek et al. | |
| 2017/0115556 A1 | 4/2017 | Shim et al. | |
| 2017/0329888 A1 | 11/2017 | Kim et al. | |
| 2019/0163048 A1* | 5/2019 | Choi | .......................... G03F 1/70 |

FOREIGN PATENT DOCUMENTS

| | | |
|---|---|---|
| JP | 2004-341157 A | 12/2004 |
| JP | 5841009 B2 | 1/2016 |
| KR | 10-0702794 B1 | 4/2007 |
| KR | 10-2011-0012295 A | 2/2011 |

OTHER PUBLICATIONS

Clifford et al., "EUV OPC for the 20-nm node and Beyond." Proc. SPIE 8322, Extreme Ultraviolet (EUV) Lithography III, 83221M (Mar. 23, 2012); doi: 10.1117/12.916171.

* cited by examiner

*Primary Examiner* — Christopher G Young
(74) *Attorney, Agent, or Firm* — Muir Patent Law, PLLC

(57) ABSTRACT

A method of manufacturing a semiconductor device includes performing extreme ultraviolet (EUV) lithography that uses a mask for the EUV lithography manufactured by using a design layout on which optical proximity correction (OPC) is performed, and performing the OPC includes dividing respective patterns included in the design layout into partial patterns, classifying the partial patterns into a plurality of partial pattern groups, performing a first OPC on the design layout, and performing a second OPC that is different from the first OPC on the design layout on which the first OPC is performed, wherein performing the first OPC is performed on representative patterns selected from the plurality of partial pattern groups.

20 Claims, 13 Drawing Sheets

METHODS OF MANUFACTURING SEMICONDUCTOR DEVICES, METHOD SOF PERFORMING EXTREME ULTRAVIOLET RAY EXPOSURE, AND METHODS OF PERFORMING OPTICAL PROXIMITY CORRECTION

CROSS-REFERENCE TO RELATED APPLICATION

This application claims the benefit of Korean Patent Application No. 10-2018-0098756, filed on Aug. 23, 2018, in the Korean Intellectual Property Office, the disclosure of which is incorporated herein by reference in its entirety.

FIELD

The inventive concept relates to methods of manufacturing a semiconductor device, methods of performing extreme ultraviolet ray exposure, and methods of performing optical proximity correction, and more particularly, each of which can ensure accuracy but also reduce process time.

BACKGROUND

A lithography process in processes relating to manufacturing a semiconductor device is a technique of forming a circuit pattern by irradiating a light beam onto a photosensitive film coated on a substrate. At least due to recent refinement to the processes, exposure techniques using extreme ultraviolet rays (EUV) and electron beams are brought into the spotlight. As patterns are miniaturized, an optical proximity effect (OPE) can occur at least due to the influence between the patterns during an adjacent exposure process, and research into optical proximity correction (OPC) has been conducted to solve this limitation.

SUMMARY

The inventive concept provides methods of manufacturing a semiconductor device, methods of performing extreme ultraviolet ray exposure, and methods of performing optical proximity correction that can provide reduced process time.

The technical concept of the inventive concept is not limited by the description above, and other embodiments that are not mentioned will be clearly understood by those skilled in the art from the following description.

According to an aspect of the inventive concept, there is provided a method of manufacturing a semiconductor device, the method including: performing optical proximity correction (OPC) on a design layout; manufacturing a mask for extreme ultraviolet (EUV) lithography depending on a result of the OPC; and performing EUV lithography using the mask for EUV lithography, wherein performing OPC includes: dividing respective patterns included in the design layout into partial patterns; classifying the partial patterns into a plurality of partial pattern groups; performing a first OPC on the design layout; and performing a second OPC that is different from the first OPC on the design layout on which the first OPC is performed, wherein performing the first OPC includes correcting representative patterns selected from the plurality of partial pattern groups.

According to another aspect of the inventive concept, there is provided a method of performing extreme ultraviolet (EUV) exposure, the method including: performing optical proximity correction (OPC) on a design layout; inputting mask tape out (MTO) design data obtained via the OPC; preparing mask data including data format conversion, mask process correction (MPC), and job deck with respect to the MTO design data; and performing an EUV writing operation on a substrate for a mask based on the mask data, wherein performing the OPC includes: selecting some patterns included in the design layout; performing a plurality of times a first OPC that corrects the selected patterns; and performing a second OPC that corrects an entire region of the design layout on which the first OPC is iteratively performed.

According to another aspect of the inventive concept, there is provided a method of performing optical proximity correction (OPC), the method including: dividing respective patterns included in a design layout into partial patterns; classifying the partial patterns into a plurality of partial pattern groups; performing first OPC a plurality of times on representative patterns selected from each of the plurality of partial pattern groups; and performing a second OPC that is different from the first OPC one or more times on the design layout on which the first OPC is iteratively performed.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
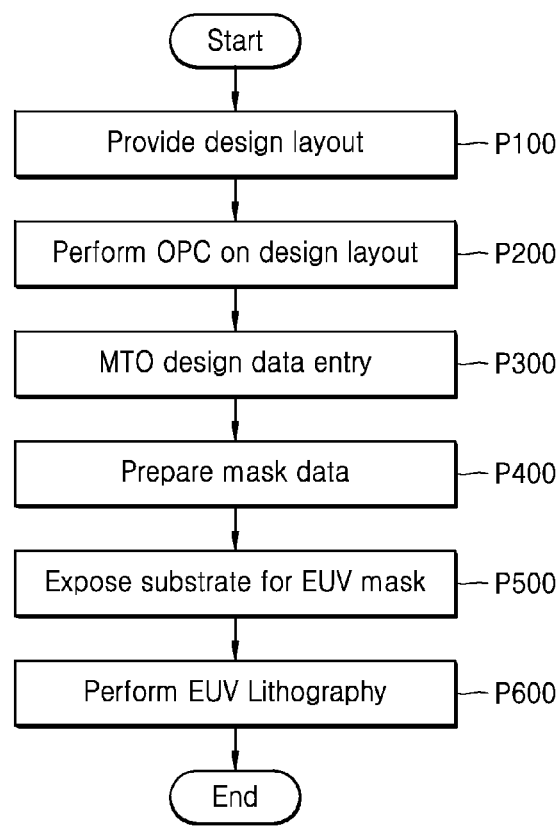
FIG. 1 is a flowchart illustrating a process of a method of manufacturing a semiconductor device according to some embodiments.

Hereinafter, embodiments of the inventive concept will be described in detail with reference to the accompanying drawings. Like reference numerals refer to like elements in the drawings, and a duplicate description thereof will be omitted.

FIG. 1 is a flowchart illustrating a process of a method of manufacturing a semiconductor device, according to some embodiments.

Figure 5:
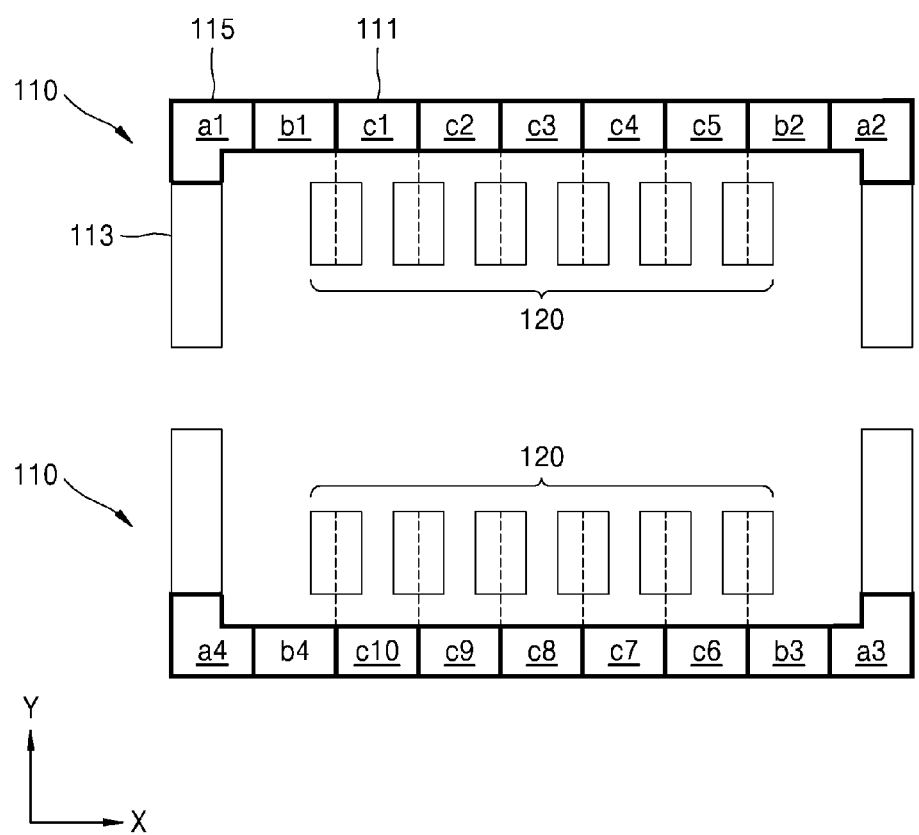
Figure 11A:
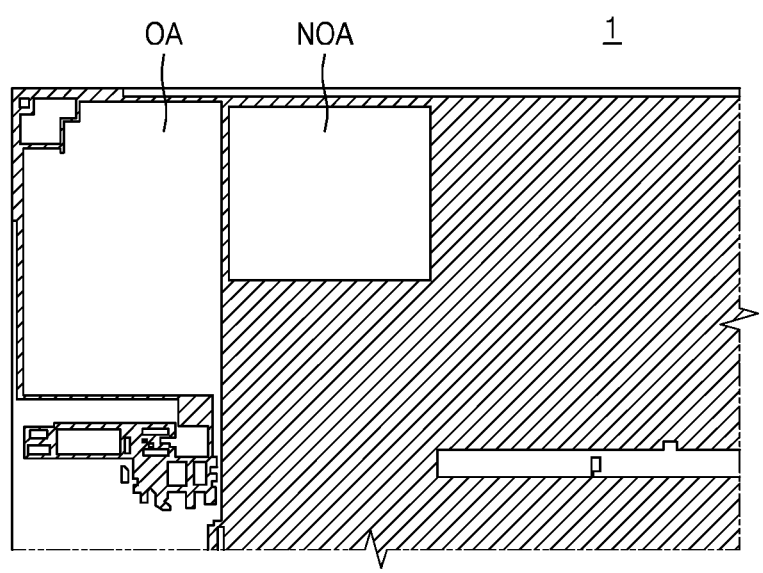
FIGS. 11A and 11B are plan views illustrating the method of performing OPC according to some embodiments.

Referring to FIG. 1, a design layout may be provided at operation P100. The design layout may include various geometric patterns for implementing the semiconductor device that is to be implemented. An example of the design layout is shown in FIGS. 5 and 11A. The design layout may include a plurality of patterns designed according to certain design rules. The design layout may extend in the first direction and in the second direction, and the first direction and the second direction are perpendicular to each other. The patterns may include line patterns having a certain width and extending in the first direction or in the second direction. The various geometric patterns of the design layout may correspond to a metal pattern, an oxide pattern, or a semiconductor pattern used for implementing various components of the semiconductor device to be manufactured. The components may include, for example, active regions, gate electrodes, metal lines or vias of interlayer interconnects, and bonding pads. The components may be formed on a substrate, or on various material layers stacked on the substrate. The design layout may be stored in one or more data files that have information on the geometric patterns. For example, the design layout may be stored as any suitable data format readable by a computer, such as a graphic database system information interchange (GDSII) data format, a Caltech intermediate form (CIF) data format, an open artwork system interchange standard (OASIS), and the like.

Then, optical proximity correction (OPC) may be performed at operation P200. According to some embodiments, performing OPC may include sequentially performing a first OPC and a second OPC, where the first OPC and the second OPC are different from each other.

According to some embodiments, the first OPC may be an OPC with respect to some of the patterns included in the design layout. According to some embodiments, the second OPC may be an OPC with respect to all of the patterns included in the design layout.

According to some embodiments, the first OPC may be an OPC not considering the effects caused by aberration and/or flare. According to some embodiments, the second OPC may be an OPC considering the effects caused by aberration and/or flare.

Herein, flare refers to scattering of light. Flare is classified into global flare caused by light scattered on a rough surface of a lens element and local flare caused by light scattered by adjacent patterns. When flare occurs, an unintentional change occurs in local/global exposure intensity, resulting in distortion in a pattern implemented.

Aberration, as a concept encompassing intensity and phase of light, refers to the difference between a reference spherical surface centered on an image point and a wavefront of light having passed through an optical system. The aberration may be caused by the optical path difference between an ideal wavefront and a wavefront passing through the optical system. When the maximum value of the aberration amount is less than a quarter wavelength, the phase may be regarded as having no significant difference from the case in which no aberration occurs, which is referred to as Rayleigh's limit. The aberration exceeding the Rayleigh's limit may cause distortion in the pattern implemented by exposure. A slit used in a EUV exposure process may have a curvilinear structure in the shape of circular arc rather than a rectangular structure. Since the slit has a curvilinear structure, an azimuth angle of light passing through the slit varies depending on portions of the slit. Such a difference of the azimuth angle depending on positions of the slit may cause aberration in the light passing through the slit.

According to some embodiments, the first OPC compared to the second OPC may be an OPC with reduced time and may be iterated multiple times. According to some embodiments, the second OPC may be performed one or more times. According to some embodiments, the first OPC may be performed more times than the second OPC. A particular method of performing OPC will be described in detail below with reference to FIGS. 2 and 3.

Then, mask tape out (MTO) design data may be input at operation P300. The MTO may refer to a request for producing a mask by passing design data to which OPC is completely performed. According to some embodiments, the MTO design data may have a graphic data format used in electronic design automation (EDA) software or the like. According to some embodiments, the MTO design data may have such a data format as GDS II, CIF, OASIS, and the like.

Then, mask data preparation (MDP) may be performed at operation P400. According to some embodiments, the MDP may include, e.g., format conversion referred to as fracturing, augmentation of a barcode for mechanical readout, a standard mask pattern for inspection, and job deck etc., and automatic and manual verification. According to some embodiments, the job deck may refer to generation of a text file with respect to a series of instructions, such as arrangement information of multi mask files, a reference dose, and an exposure rate or mode. A mask rule check may be included to confirm that the corrected design layout complies with mask generation rules containing particular geometric shapes and constraints of connections to secure a sufficient margin in semiconductor manufacturing processes to prevent defects due to tolerances.

According to some embodiments, the format conversion, i.e., fracturing, may refer to a process of segmenting the MTO design data into respective sections and converting the MTO design data into a format for an electron beam exposure device. According to some embodiments, the fracturing may be a process that improves the quality of a final mask and is performed in advance for mask process correction. The fracturing may include data manipulation, for example, scaling, data sizing, data rotation, pattern reflection, color inversion, and the like.

According to some embodiments, during a process of conversion by the fracturing, data regarding systematic errors that may occur during a process of transferring design data to an image on a wafer may be corrected. The systematic errors may be caused by distortions occurring in, e.g., an exposure process, a mask development and etching process, and a wafer imaging process.

According to some embodiments, the MDP may include mask process correction (MPC) that is a process of correcting data for the systematic errors. According to some embodiments, the MPC may include operations such as critical dimension adjustment and/or pattern arrangement accuracy improvement.

Subsequently, a mask substrate may be exposed based on mask data at operation P500. According to some embodiments, the exposure may be performed, e.g., by electron beam writing. According to some embodiments, the electron beam writing may proceed in such a manner as a gray writing that uses a multi-beam mask writer (MBMW). According to some embodiments, the electron beam writing may be performed by using a variable shape beam (VSB) exposure device.

According to some embodiments, data processing may be performed prior to the exposure process. According to some embodiments, the data processing is a pre-processing process for the mask data and may include grammar checking for the mask data and a prediction of exposure time. According to some embodiments, after the MDP, a process of converting the mask data into pixel data may be performed before the exposure process. The pixel data may be data used directly for actual exposure and may include data on a shape to be exposed and data on a dose assigned to each shape. According to some embodiments, the data on the shape to be exposed may be bit-map data converted from shape data, which is vector data, through rasterization.

Thereafter, an EUV mask may be formed by performing subsequent processes at the operation P500. According to some embodiments, the subsequent processes may include processes such as development, etching, and cleaning. According to some embodiments, the subsequent processes for forming the EUV mask may include a measurement process, a defect checking, or a defect repairing process. According to some embodiments, the subsequent processes for forming the EUV mask may include a pellicle coating process. The pellicle coating process may refer to a process of attaching pellicles to a surface of the EUV mask in order to protect the mask from contamination or impact during delivery of the mask and an available lifespan of the mask after confirming that the surface of the EUV mask has no contaminated particles or chemical stains by final cleaning and inspection.

Then, at operation P600, a semiconductor device may be fabricated by performing various semiconductor processes on the substrate with the manufactured EUV mask. According to some embodiments, a process using the EUV mask may include a patterning process by means of the EUV exposure process. According to some embodiments, an expected pattern may be formed on the substrate or a material layer through the process using the EUV mask.

According to some embodiments, the process using the EUV mask may include a deposition process, an etching process, an ion implantation process, and a cleaning process. According to some embodiments, the deposition process may include such a process for forming a material layer as chemical vapor deposition, atomic layer deposition, sputtering, and spin coating. According to some embodiments, the ion process may include such a process as ion implantation, diffusion, and thermal treatment. According to some embodiments, the process using the EUV mask may include a packaging process, in which the semiconductor device is mounted on a printed circuit board (PCB) and is sealed by a sealant. According to some embodiments, the process using the EUV mask may include a test process of performing tests for a semiconductor device or a package.

Figure 2:
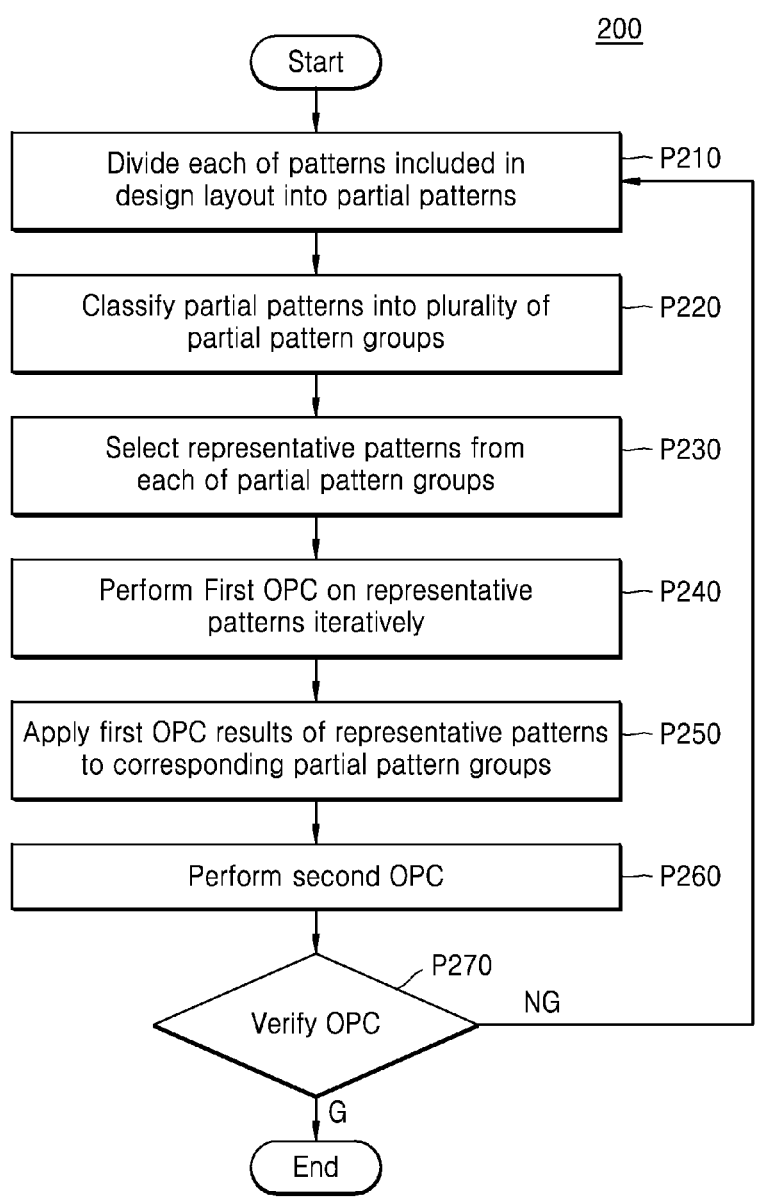
FIGS. 2 and 3 are flowcharts illustrating a method of performing optical proximity correction (OPC) according to some embodiments.
Figure 3:
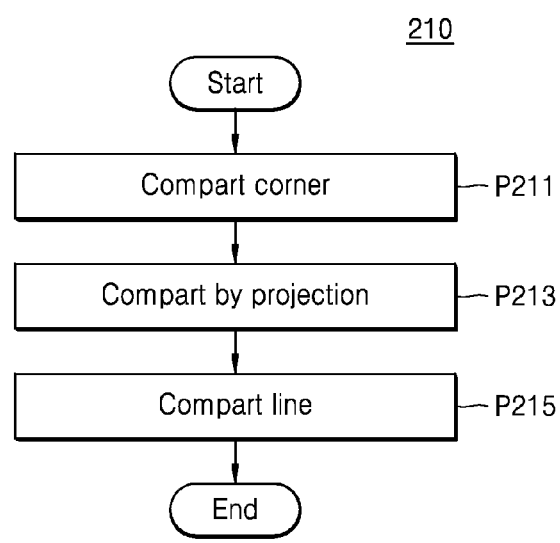

FIGS. 2 and 3 are flowcharts illustrating the method of performing OPC according to some embodiments.

FIGS. 4 to 7 are plan views illustrating portions of the design layout to explain the method of performing OPC according to some embodiments.

Figure 7:
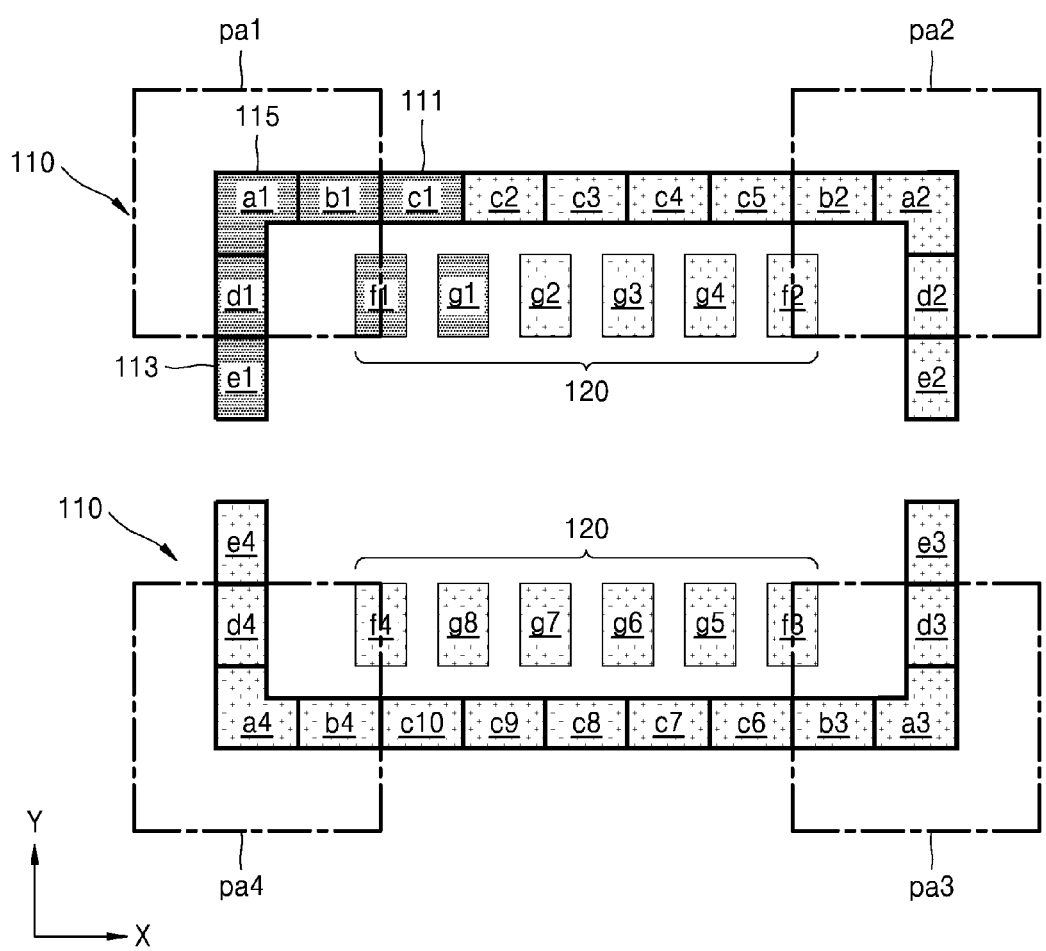
Figure 8A:
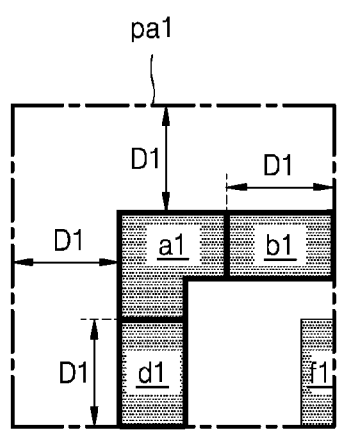
FIGS. 8A to 9 are partial plan views illustrating the method of performing OPC according to some embodiments.
Figure 8B:
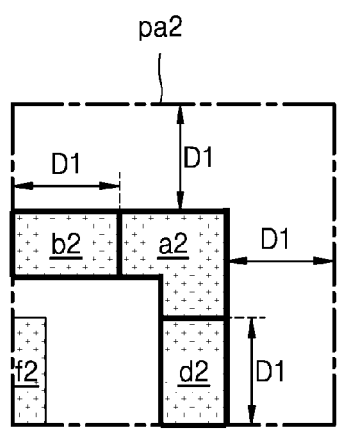
Figure 8C:
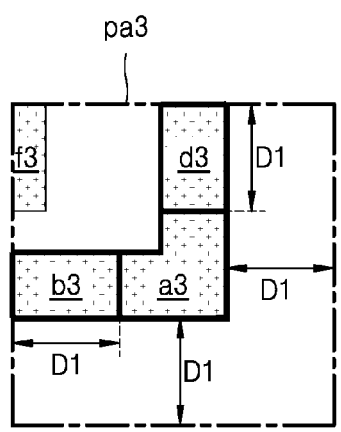
Figure 8D:
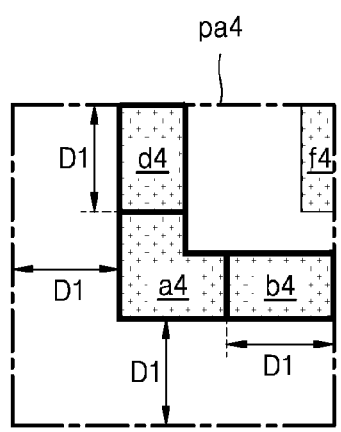
Figure 9:
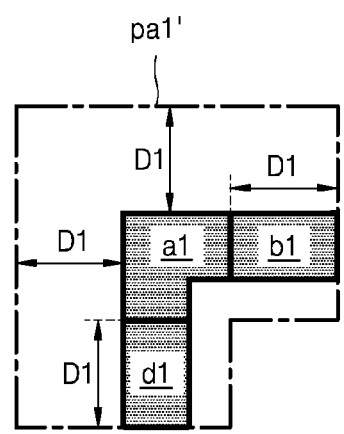

FIGS. 8A to 9 are partial plan views illustrating the method of performing OPC according to some embodiments. In detail, FIGS. 8A to 8D are respective enlarged views of first to fourth patches, e.g., pa1, pa2, pa3 and pa4, of FIG. 7 in order, and FIG. 9 is a diagram illustrating first patch, e.g., pa1', corresponding to FIG. 8A in accordance with some other embodiments.

Referring to FIG. 2, the operation P200 may include dividing the patterns into partial patterns at operation P210, classifying the partial patterns into a plurality of partial pattern groups at operation P220, selecting representative patterns from the partial pattern groups at operation P230, iteratively performing the first OPC on the representative patterns multiple times at operation P240, applying results of the first OPC of the representative patterns to the partial pattern groups corresponding thereto at operation P250, performing the second OPC at operation P260, and verifying results of the first OPC and the second OPC at operation P270.

The division of the patterns into the partial patterns at the operation P210 will be described with reference to FIGS. 3 to 6.

Figure 4:
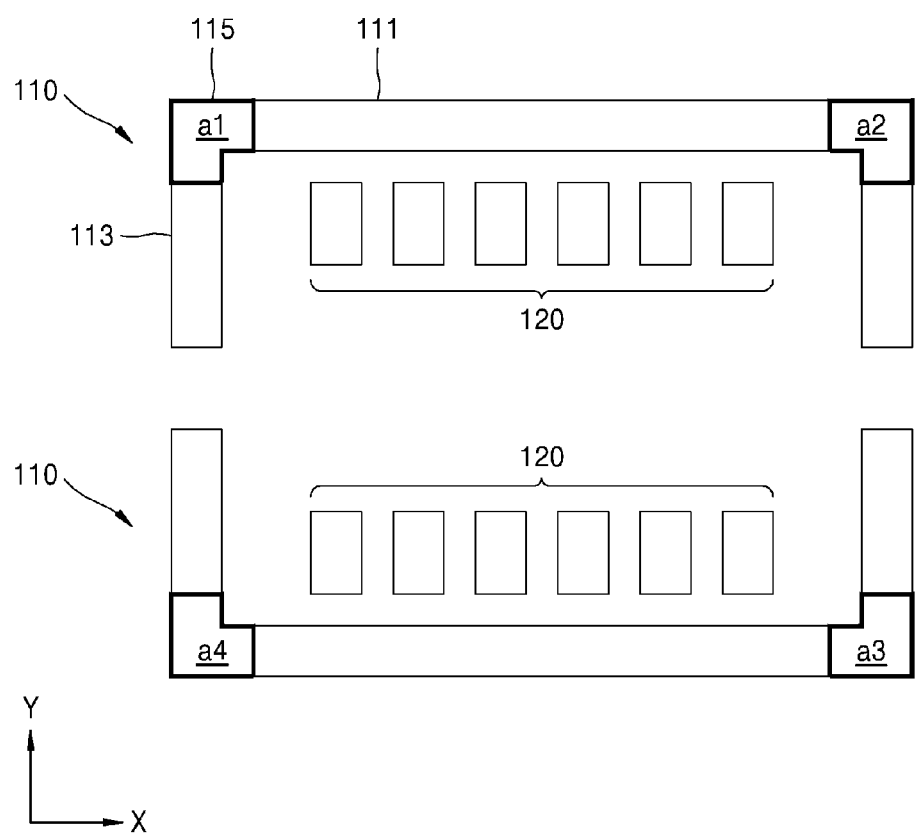
FIGS. 4 to 7 are plan views illustrating portions of a design layout to explain the method of performing OPC according to some embodiments.

Referring to FIGS. 3 and 4, the design layout may include first patterns 110 and second patterns 120. As described above, the design layout may extend in the first direction and in the second direction, e.g., X direction and Y direction. Herein, the first direction and the second direction, e.g., X direction and Y direction, may be perpendicular to each other. A definition of the first direction and the second direction, e.g., X direction and Y direction, remain the same for the following drawings unless otherwise specified.

The first patterns 110 may include first portions 111 having a certain width and extending in the first direction, e.g., X direction, second portions 113 having a certain width and extending in the second direction, e.g., Y direction, and third portions 115 connecting the first portions 111 to the second portions 113.

The second patterns 120 may have a certain width and may extend in the second direction, e.g., Y direction. A length of the second patterns 120 in the second direction, e.g., Y direction, may be less than that of the second portions 113 in the second direction, e.g., Y direction.

At operation P211, after recognizing the third portions 115, partial patterns may be formed by segmenting the third portions 115 that are recognized. The partial patterns formed at the operation P211 are referred to as corner patterns, e.g., a1, a2, a3, and a4, which connect a part of the first patterns 110 extending in the first direction, e.g., X direction, and a part of the first patterns 110 extending in the second direction, e.g., Y direction.

Hereinafter, the maximum distance that an interaction between the patterns is perceived to be present is referred to as a reference distance of interaction in an OPC model. According to some embodiments, lengths of the corner patterns, e.g., a1, a2, a3, and a4, in the first direction, e.g., X direction, and in the second direction, e.g., Y direction, may be less than the reference distance of interaction. According to some embodiments, the lengths of the corner patterns, e.g., a1, a2, a3, and a4, in the first direction, e.g., X direction, and in the second direction, e.g., Y direction, may be less than about 10 times a EUV wavelength for lithography. According to some embodiments, the lengths of the corner patterns, e.g., a1, a2, a3, and a4, in the first direction, e.g., X direction, and in the second direction, e.g., Y direction, may be less than about 11.5 times the EUV wavelength for lithography.

Referring to FIGS. 3 and 5, at operation P213, a partial pattern may be formed by comparting the first portions 111. The first portions 111 may be compartmentalized by projection lines passing through each center of the second patterns 120 and parallel to the second direction, e.g., Y direction. Partial patterns formed at the operation P213 may be row patterns, e.g., b1, b2, b3, b4, c1, c2, c3, . . . , c10, extending in the first direction, e.g., X direction. According to some embodiments, lengths of the row patterns, e.g., b1, b2, b3, b4, c1, c2, c3, . . . , c10, in the first direction, e.g., X direction, and in the second direction, e.g., Y direction, may be less than the reference distance of interaction. According to some embodiments, the lengths of the row patterns, e.g., b1, b2, b3, b4, c1, c2, c3, . . . , c10, in the first direction, e.g., X direction, and in the second direction, e.g., Y direction, may be less than about 10 times the EUV wavelength for lithography. According to some embodiments, the lengths of the row patterns, e.g., b1, b2, b3, b4, c1, c2, c3, . . . , c10, in the first direction, e.g., X direction, and in the second direction, e.g., Y direction, may be less than about 11.5 times the EUV wavelength for lithography.

Figure 6:
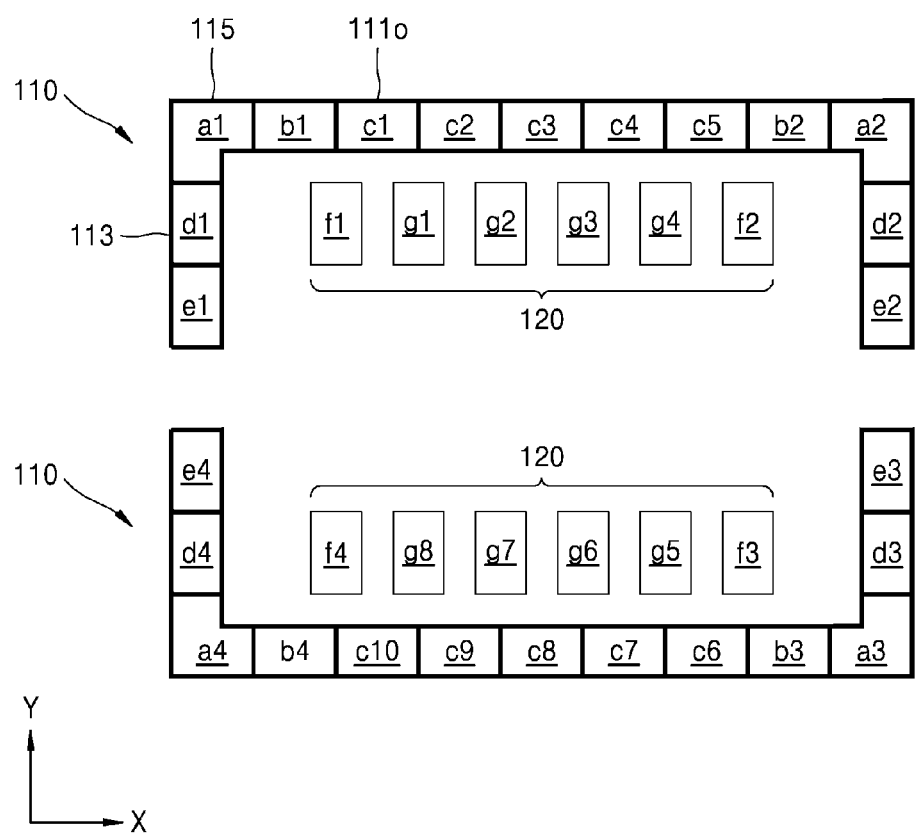

Referring to FIGS. 3 and 6, at operation P215, line-shaped patterns exceeding a certain first length that is set may be compartmentalized. According to some embodiments, the compartmentalization at operation P215 divides a line pattern exceeding the first length so that a length of respective partial patterns formed by the division may not exceed the first length. According to some embodiments, the first length may be less than the reference distance of interaction. According to some embodiments, the first length may be less than about 10 times the EUV wavelength for lithography. According to some embodiments, the first length may be less than about 11.5 times the EUV wavelength for lithography.

According to some embodiments, the compartmentalization of the line pattern may equally divide the line pattern so that the partial patterns formed by the division may have the same length, but the inventive concept is not limited thereto. For example, a length of lines formed at operation P215 may be different from each other. According to some embodiments, the second portions 113 may be compartmentalized at operation P215 so that the partial patterns divided may have the maximum length that is less than the first length. For example, when the first length is 140 nm and a length of a line pattern is 500 nm before a division, the line pattern with the length of 500 nm may be divided into quarters so as to have a length of 125 nm in the length direction. However, the inventive concept is not limited thereto, and when the first length is 140 nm and the maximum length of the line pattern is 500 nm before the division, the line pattern with the length of 500 nm may be divided into five or more partial patterns.

The partial patterns formed at the operation P215 may be column patterns, e.g., d1, d2, d3, d4, e1, e2, e3, and e4, extending in the second direction, e.g., Y direction. The second patterns 120 may be defined as column patterns, e.g., f1, f2, f3, f4, g1, g2, g3, . . . , and g8, without being compartmentalized since a length of the second patterns 120 in the second direction does not exceed the first length.

Referring to FIG. 6, only the second portions 113 are shown as being compartmentalized at the operation P215, but the inventive concept is not limited thereto. For example, when some of the corner patterns and the row patterns exceed the first length, some of the corner patterns and the row patterns may be further compartmentalized at operation P215. In addition, when the length of the second patterns 120 in the second direction, e.g., Y direction, exceeds the first length, the second patterns may also be compartmentalized.

Referring to FIGS. 2, 7, and 8A to 8D, the partial patterns may be classified into the plurality of the partial pattern groups at the operation P220. According to some embodiments, the partial patterns may be classified into the plurality of the partial pattern groups by taking into account the shape of a partial pattern and the surrounding environment of the partial pattern. Herein, the first to fourth patches, e.g., pa1, pa2, pa3, and pa4, which are virtual regions, are temporarily defined in order to describe a method of taking into account the surrounding environment of the partial pattern.

According to some embodiments, the first to fourth patches, e.g., pa1, pa2, pa3, and pa4, may include edges spaced by the first distance D1 from respective edges of the corner patterns, e.g., a1, a2, a3, and a4. According to some embodiments, the edges of the first to fourth patches, e.g., pa1, pa2, pa3, and pa4, may be parallel to the edges of the corner patterns, e.g., a1, a2, a3, and a4, respectively adjacent thereto. According to some embodiments, each of the first to fourth patches, e.g., pa1, pa2, pa3, and pa4, may be a region having a quadrilateral profile. According to some embodiments, each of the first to fourth patches, e.g., pa1, pa2, pa3, and pa4, may be a region having a rectangular profile.

According to some embodiments, as shown in FIG. 9, the first patch, e.g., pa1', may be a polygon having an identical number of vertexes as the corner pattern a1. Each edge of the first patch, e.g., pa1', may substantially be parallel to each edge of the corner pattern a1 to which the first patch, e.g., pa1', is adjacent and may be spaced by the first distance D1.

Figure 10:
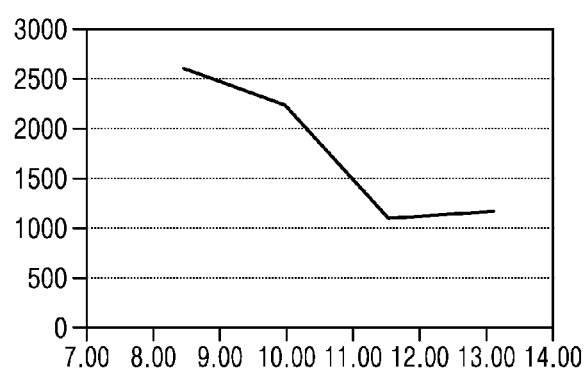
FIG. 10 is a graph illustrating an effect of the method of performing OPC according to some embodiments.

Herein, a correlation between a range of the first distance D1 and the accuracy of the OPC will be described with reference to FIG. 10. FIG. 10 is a graph illustrating an effect of the method of performing OPC according to some embodiments.

The graph of FIG. 10 illustrates a simulation result of changes in the number of defects included in a full shot depending on changes in the first distance D1. The horizontal axis of FIG. 10 represents the first distance D1, and a standardized scale obtained by dividing the first distance D1 with the EUV wavelength is used. The vertical axis of FIG. 10 represents the number of defects generated. Table 1 below shows the results of FIG. 10.

TABLE 1

| Length of D1 | Number of defects |
| --- | --- |
| 8.5 | 2594 |
| 10.0 | 2218 |
| 11.5 | 1092 |
| 13.0 | 1175 |

Herein, the full shot may correspond to an entire mask pattern that may be transferred through one scanning operation. In general, the EUV exposure process may be performed as a reduction projection, e.g., about 4:1 reduced projection. The mask pattern may be reduced by a size of about ¼ and may be transferred to a wafer, and accordingly, the full shot may correspond to about ¼ of the size of the entire mask pattern. Herein, ¼ is a reduction ratio of length, and an area may be reduced by about 1/16.

In addition, herein, a shooting method of an exposure device may be categorized into a scanning method of continuous shooting and a stepping method of step-by-step shooting. Meanwhile, the EUV exposure process is generally performed in the scanning method, and accordingly, the EUV exposure device may be generally referred to as a scanner. Further, in the EUV exposure device, the scanning may be performed by using a slit that restricts light to a partial region on the mask. Herein, the slit may be a unit for restricting light in an apparatus that performs the EUV exposure process so that light may be uniformly irradiated on the EUV mask. Light may be continuously irradiated while moving the mask to the opposite direction of a direction to be scanned in spite of restricting light to be irradiated to a partial region on the mask by using the slit. As such, the region on a test substrate to which light is irradiated through the scanning over the entire region of the mask may be a region corresponding to the full shot.

In some embodiments, the full shot may have a size of about 26 mm in the X-axis direction and about 33 mm in the Y-axis direction. However, the full shot may not be limited to the numerical values stated above. Meanwhile, since the full shot proceeds by the scanning through the slit as described above, a portion corresponding to the size of the slit may correspond to a part of the full shot.

Unlike the cases in which about 15% of defects are reduced when the first distance D1 is changed to about 10.0 times the EUV wavelength from about 8.5 times thereof and in which about 50% or more of the defects are reduced when the first distance D1 is changed to about 11.5 times the EUV wavelength from about 10.0 times thereof, it may be confirmed that the defects are slightly increased when the first distance D1 is increased to about 13.0 times of the EUV wavelength from about 11.5 times thereof. Given that a certain number of defects inevitably occur after performing the OPC, it may be confirmed that the saturation point of the decrease of the defects is reached when exceeding a point of about 11.5 times the EUV wavelength. According to some embodiments, the accuracy of an OPC result may be assured by determining the patches, e.g., pa1, pa2, pa3, and pa4, with the first distance D1 being set to 11.5 times or more the EUV wavelength.

The larger the first distance D1, the wider the range of patterns to be considered for forming a partial pattern group, and more partial pattern groups are required. As described later, the representative patterns are selected from the partial pattern groups and the OPC is performed on the representative patterns. The number of representative patterns increases when the number of partial pattern groups increases, which indicates the increase in execution time of the first OPC. According to some embodiments, the accuracy of the OPC is ensured by performing the first OPC after selecting the representative patterns using the patches constructed by the first length D1 (referring to FIG. 8A) which is about 11.5 times the EUV wavelength, and the time required for performing the OPC may be further reduced, concurrently.

Referring to FIGS. 2 and 7 again, when the partial patterns are classified according to the shape of a partial pattern and the shape of patterns arranged in a patch corresponding to the partial pattern, the corner patterns, e.g., a1, a2, a3, and a4, may form a first partial pattern group. Specifically, since the second patch pa2 and the first patch pa1 are in a mirror image relation, patterns a1 and a2 may be classified into the same partial pattern group. In addition, since the third patch pa3 is identical to the first patch pa1 rotated, for example, by 180 degrees in the clockwise direction, patterns a1 and a3 may be classified into the same partial pattern group. Since the fourth patch pa4 is identical to the second patch pa2, which is mirror symmetric to the first patch pa1 and which is rotated, for example, by 180 degrees in the clockwise direction, patterns a1 and a4 may be classified into the same partial pattern group.

Similarly, the row patterns, e.g., b1, b2, b3, and b4, which are adjacent to the corner patterns, e.g., a1, a2, a3, and a4, may form a second partial pattern group. The row patterns, e.g., c1, c2, c3, . . . , and c10, that are not adjacent to the corner patterns, e.g., a1, a2, a3 and a4, may form a third partial pattern group. Among the column patterns, e.g., d1, d2, d3, d4, e1, e2, e3, and e4, included in the first patterns 110, the column patterns, e.g., d1, d2, d3, and d4, that are adjacent to the corner patterns, e.g., a1, a2, a3, and a4, may form a fourth partial pattern group. Among the column patterns, e.g., d1, d2, d3, d4, e1, e2, e3, and e4, included in the first patterns 110, the column patterns, e.g., e1, e2, e3, and e4, that are not adjacent to the corner patterns, e.g., a1, a2, a3, and a4, may form a fifth partial pattern group. Among the column patterns, e.g., f1, f2, f3, f4, g1, g2, g3, g4, g5, g6, g7, and g8, included in the second patterns 120, the column patterns, e.g., f1, f2, f3, and f4, that are the closest to the corner patterns, e.g., a1, a2, a3 and a4, may be classified into a sixth partial pattern group. Among the column patterns, e.g., f1, f2, f3, f4, g1, g2, g3, g4, g5, g6, g7, and g8, included in the second patterns 120, the column patterns, e.g., g1, g2, g3, g4, g5, g6, g7 and g8, arranged between the column patterns of the sixth partial pattern group, e.g., f1, f2, f3 and f4, may be classified into a seventh partial pattern group.

Certainly, the method of classifying the partial pattern groups described above is an example for describing the inventive concept, and should not limit the scope of the inventive concept in any manner. More specifically, in FIG. 7, although the row patterns, e.g., c1, c2, c3, . . . , and c10, that are not adjacent to the corner patterns are classified into the same partial pattern group, it may be possible for the row patterns that are not adjacent to the corner patterns to be included in a different partial pattern group depending on a length and spacing of the row patterns in the first direction, e.g., X direction, and a length and spacing of the column patterns in the second direction, e.g., Y direction.

Subsequently, at the operation P220, a representative pattern may be selected from each of the partial pattern groups. The representative pattern may be a pattern arbitrarily selected from each of the partial pattern groups. For example, any of the corner patterns, e.g., a1 to a4, in the first partial pattern group may be a representative pattern, and the same is true for the second to seventh partial pattern groups.

According to some embodiments, a1, b1, c1, d1, e1, f1, and g1 may be selected from the first to seventh partial pattern groups. Referring to FIG. 7, the representative patterns are shown to be distinguishable from other partial patterns. In this case, at least one representative pattern is selected from each of the first to seventh partial pattern groups, and the speed of OPC calculation may be further improved as the representative patterns are arranged adjacent to each other. As such, the method of selecting the representative patterns, which are to be adjacent to each other, may be referred to as clustering.

The first OPC may be performed at the operation P240. The first OPC may include correcting the representative patterns selected from the first to seventh partial pattern groups. According to some embodiments, the representative patterns may have a different shape before and after a correction. Correcting the representative patterns may have some of the representative patterns have an identical shape before and after the correction, but it is not limited thereto.

Correcting the representative patterns by the first OPC indicates correcting the representative patterns so as to transfer a target design layout by a mask pattern for EUV lithography. According to some embodiments, correcting the representative patterns may include correcting the shape of a representative pattern or the size of the representative pattern. According to some embodiments, the first OPC may be either one of a rule-based OPC or a model-based OPC.

The rule-based OPC is a method of determining an OPC rule based on a difference between a pattern transferred to the test substrate and a design pattern. A mask pattern for test is manufactured, and the mask pattern for test is transferred to the substrate to manufacture the test substrate. Thereafter, a design rule for determining bias data to be applied to design data of a mask pattern may be determined based on measurement data for a pattern formed on the substrate and design data of a mask for test. When the design rule is determined, the mask pattern may be corrected based on the design rule. The correction may be performed at a layout CAD stage of the mask pattern. The rule-based OPC may be time-consuming and costly because it measures test patterns for all the patterns allowable in design and repeats the operation whenever the process changes.

The model-based OPC may form a process model including kernels by simulation, and may be performed by simulation using the process model. The kernels representing a transfer process taking into account an optical proximity effect are generated based on measurement results and/or simulation results for a test pattern. A difference between the shape of the mask pattern and the shape of a pattern transferred to the substrate may be obtained by simulation through the process model including the kernels, and the mask pattern may be corrected according to the simulation results. The model-based OPC may reduce processing time and cost due to no need to measure a large number of the test patterns.

The first OPC may include not only a modification of a pattern layout but also a method of adding sub-lithographic features referred to as serifs onto corners of a pattern or a method of adding sub-resolution assist features (SRAFs) such as scattering bars.

Herein, the serifs may be rectangular features located on each of the corners of the pattern and may sharpen the corners of a pattern that is ultimately transferred onto the substrate. According to some embodiments, the serifs may be used in an intersection region to compensate for a distortion factor caused by the intersection of two different patterns.

The SRAF may be formed in a size smaller than the resolution of exposure equipment and may be a feature that is not transferred to a resist layer. That is, the SRAF may not be a pattern that is actually formed on the substrate. The SRAF may be an auxiliary pattern which is introduced to solve the problem of OPC deviation caused by the density difference of patterns.

Herein, the first OPC may be iterated multiple times over the representative patterns. Specifically, the representative patterns may be corrected according to the OPC rule, and the representative patterns corrected may iteratively be corrected according to the OPC rule.

Figure 11B:
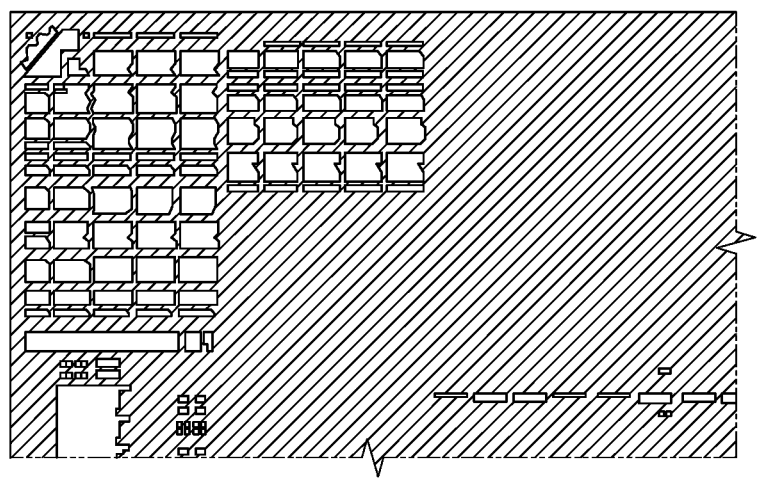

FIGS. 11A and 11B are plan views illustrating the method of performing OPC, according to some embodiments. Specifically, FIG. 11A illustrates a design layout 1 corresponding to one full shot at the stage of the first OPC of the operation P240 and FIG. 11B illustrates a design layout 1 corresponding to one full shot after the stage of the first OPC of the operation P240.

Referring to FIG. 11A, the design layout 1 of the stage of the first OPC may include an OPC performing area OA and an OPC non-performing area NOA. The OPC performing area OA may be a region where the representative patterns are arranged and the OPC is performed, and the OPC non-performing area NOA may be a region where the representative patterns are not arranged. According to some embodiments, the OPC performing area OA may be a region where the representative patterns that are selected by the clustering are arranged, but the inventive concept is not limited thereto.

Referring to FIGS. 2 and 11B, results of the first OPC for the representative patterns may be applied to an entire region of the design layout 1. In FIG. 11B, portions where hatching is not formed correspond to regions where patterns are not arranged at all and do not refer to a separate area where OPC is not performed. Specifically, referring to FIG. 7, a result of the first OPC of the corner pattern a1, which is selected as a representative pattern, may be applied to the entire first partial pattern group. Similarly, results of the first OPC for the representative patterns of the second to seventh partial pattern groups, e.g., b1, c1, d1, e1, f1, and g1, may be applied to the second to seventh partial pattern groups.

Referring to FIGS. 2 and 11B again, the second OPC may be performed at the operation P260. The second OPC may be performed on the entire region of the design layout 1. As described above, unlike the first OPC, the second OPC is an OPC considering the effects of flare and aberration. Therefore, the reliability of results of the OPC may be guaranteed. According to some embodiments, the second OPC may be performed one or more times. The second OPC is performed on the entire region of the design layout 1, but respective patterns included in the design layout 1 may not be corrected by each operation of the second OPC. That is, some of the patterns may remain the same before and after performing the second OPC. Specifically, for the second OPC, a particular pattern included in the design layout 1 before a correction may be identical to the corresponding pattern included in the design layout 1 after the correction.

Table 2 is a table showing the reliability of general OPC, e.g., a comparative example, in which an OPC operation is repeatedly performed on an entire layout and that of OPC according to some embodiments. Referring to Table 2, it may be confirmed that both the number of defects and the types of defects are reduced for OPC according to some embodiments.

TABLE 2

|  | Comparative Example | Example |
| --- | --- | --- |
| Types of defects | 7 | 2 |
| Number of total defects | 81012 | 51537 |

Subsequently, at the operation 270, an OPC verification model may be generated to perform an OPC verification. According to some embodiments, the OPC verification model may be the result of correcting an OPC model. The OPC verification may be a process of performing a simulation based on the OPC verification model and inspecting whether a mask pattern obtained by the simulation matches a target mask pattern. According to some embodiments, the OPC verification may include inspecting whether the OPC has been properly performed by using the simulation contour of a pattern.

According to some embodiments, when the simulation contour based on the OPC verification model is within an error tolerance (G), the OPC may be terminated and a subsequent process may be performed. According to some embodiments, when the simulation contour based on the OPC verification is out of the error tolerance (NG), the OPC model may be corrected by correcting parameters such as model calibration, OPC recipe, and bias. Then, the first OPC may be performed by returning to the operation P210.

Figure 12A:
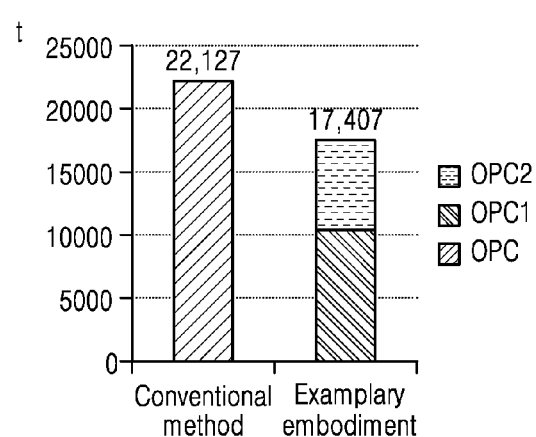
FIGS. 12A and 12B are graphs illustrating an effect of the method of performing OPC according to some embodiments.
Figure 12B:
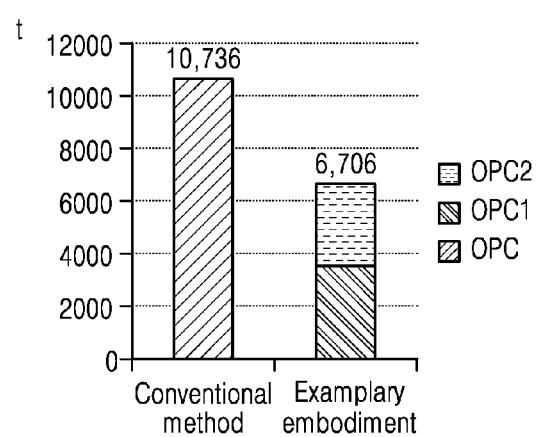

FIGS. 12A and 12B are graphs illustrating an effect of the method of performing OPC according to some embodiments.

FIGS. 12A and 12B illustrate the difference in processing time between the general OPC and the method of performing OPC according to some embodiments with respect to a layer for manufacturing a semiconductor device. FIGS. 12A and 12B illustrate the difference in process time with respect to different material layers.

In FIGS. 12A and 12B, the general OPC includes a total of 15 iterative executions of OPC, and OPC according to embodiments of the inventive concept includes 13 times of the first OPC and 2 times of the second OPC. Referring to FIG. 12A, an exemplary embodiment takes about 79% of the processing time, and referring to FIG. 12B, it takes about 62% of the processing time when compared to general method.

As described above, one or more embodiments have been disclosed with reference to the figures and the descriptions. While embodiments have been described herein with reference to specific terms, it should be understood that the specific terms are used merely for the purpose of describing the technical concept of the inventive concept and not for that of limiting the scope of the inventive concept defined by the appended claims. Therefore, those skilled in the art will appreciate that various changes in form and other equivalent embodiments are possible without departing from the spirit and scope of the inventive concept. Accordingly, the true scope of the inventive concept should be determined by the technical concept of the appended claims.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
   performing optical proximity correction (OPC) on a design layout;
   manufacturing a mask for extreme ultraviolet (EUV) lithography depending on a result of the OPC; and
   performing EUV lithography using the mask for EUV lithography,
   wherein performing the OPC includes:
   dividing respective patterns included in the design layout into partial patterns;
   classifying the partial patterns into a plurality of partial pattern groups;
   performing a first OPC on the design layout; and
   performing a second OPC that is different from the first OPC on the design layout on which the first OPC is performed,
   wherein performing the first OPC includes correcting representative patterns selected from the plurality of partial pattern groups.

2. The method of claim 1, wherein performing the first OPC includes correcting the representative patterns iteratively.

3. The method of claim 2, comprising, after performing the first OPC, applying results of the first OPC of the representative patterns to the partial patterns included in the plurality of the partial pattern groups to which the representative patterns respectively correspond before performing the second OPC.

4. The method of claim 1, wherein a number of times the first OPC is iteratively performed is greater than a number of times the second OPC is performed.

5. The method of claim 1, wherein the design layout extends in a first direction and in a second direction that is perpendicular to the first direction, and the partial patterns include row patterns extending in the first direction; column patterns extending in the second direction; and corner patterns, each of which is a connecting part of a row pattern and a column pattern.

6. The method of claim 5, wherein a maximum length of the partial patterns in the first direction and that of the partial patterns in the second direction are each less than about 11.5 times an EUV wavelength.

7. The method of claim 1, wherein the classifying of the partial patterns into the plurality of the partial pattern groups includes classifying the partial patterns based on patterns arranged within a patch having edges parallel to and spaced apart from respective edges of a partial pattern.

8. The method of claim 7, wherein a layout profile of the patch is one of a rectangle and a polygon having an identical number of vertexes as the partial pattern to which the patch corresponds.

9. The method of claim 7, wherein an edge of the patch is spaced apart from an edge of the partial pattern that is adjacent to the patch by at least 11.5 times a EUV wavelength.

10. The method of claim 7, wherein the classifying of the partial patterns based on the patterns arranged within the patch includes classifying the patterns within the patch that are identical to each other, identical to each other after a rotation, mirror symmetric to each other, or mirror symmetric to each other after the rotation into an identical partial pattern group.

11. The method of claim 1, wherein the second OPC is performed on an entire region of the design layout.

12. The method of claim 1, wherein the first OPC is an OPC not considering aberration and flare, and the second OPC is an OPC considering aberration and flare.

13. A method of performing extreme ultraviolet (EUV) exposure, the method comprising:
    performing optical proximity correction (OPC) on a design layout;
    inputting mask tape out (MTO) design data obtained via the OPC;
    preparing mask data including data format conversion, mask process correction (MPC), and augmentation of job deck with respect to the MTO design data; and
    performing an EUV writing operation on a substrate for a mask based on the mask data,
    wherein performing the OPC includes: selecting patterns included in the design layout;
    performing a plurality of times a first OPC that corrects the selected patterns; and
    performing a second OPC that corrects an entire region of the design layout on which the first OPC is iteratively performed.

14. The method of claim 13, further comprising, after performing the first OPC, applying results of the first OPC to the entire region of the design layout.

15. The method of claim 13, wherein the first OPC and the second OPC are respectively iterated a plurality of times, and an iteration number of the first OPC is greater than that of the second OPC.

16. A method of performing optical proximity correction (OPC), the method comprising:
    dividing respective patterns included in a design layout into partial patterns;
    classifying the partial patterns into a plurality of partial pattern groups;
    performing a first OPC a plurality of times on representative patterns selected from each of the plurality of partial pattern groups; and
    performing a second OPC that is different from the first OPC one or more times on the design layout on which the first OPC is iteratively performed.

17. The method of claim 16, further comprising, after performing the first OPC and before performing the second OPC, applying results of the first OPC to the partial patterns included in the plurality of the partial pattern groups to which the representative patterns respectively correspond.

18. The method of claim 16, wherein the classifying of the partial patterns into the plurality of the partial pattern groups includes classifying the partial patterns based on patterns arranged within a quadrilateral patch having edges extending from respective edges of a partial pattern by a certain distance.

19. The method of claim 18, wherein the classifying of the partial patterns based on the patterns arranged within the patch includes classifying the patterns within the patch that are identical to each other, identical to each other after a rotation, mirror symmetric to each other, or mirror symmetric to each other after the rotation into an identical partial pattern group.

20. The method of claim 16, wherein the first OPC is an OPC not considering aberration and flare, and the second OPC is an OPC considering aberration and flare.

* * * * *